//]:# 
United States Patent
Hsieh

(10) Patent No.: US 11,286,982 B2
(45) Date of Patent: Mar. 29, 2022

(54) AUXILIARY SLIDING CONNECTION ASSEMBLY

(71) Applicant: KANG YANG HARDWARE ENTERPRISES CO., LTD., New Taipei (TW)

(72) Inventor: Shu-Li Hsieh, New Taipei (TW)

(73) Assignee: KANG YANG HARDWARE ENTERPRISES CO., LTD., New Taipei (TW)

( * ) Notice: Subject to any disclaimer, the term of this patent is extended or adjusted under 35 U.S.C. 154(b) by 124 days.

(21) Appl. No.: 16/983,442

(22) Filed: Aug. 3, 2020

(65) Prior Publication Data

US 2021/0324911 A1    Oct. 21, 2021

(30) Foreign Application Priority Data

Apr. 17, 2020   (TW) .................................. 109204546

(51) Int. Cl.
| | |
|---|---|
| *H05K 7/14* | (2006.01) |
| *F16C 29/02* | (2006.01) |
| *H05K 7/02* | (2006.01) |
| *G06F 1/16* | (2006.01) |

(52) U.S. Cl.
CPC ................ *F16C 29/02* (2013.01); *G06F 1/16* (2013.01); *H05K 7/02* (2013.01); *H05K 7/14* (2013.01)

(58) Field of Classification Search
CPC .. F16C 29/02; G06F 1/16; H05K 7/02; H05K 7/14
See application file for complete search history.

(56) References Cited

U.S. PATENT DOCUMENTS

| | | | | |
|---|---|---|---|---|
| 5,871,365 A | * | 2/1999 | Kajiura .............. | G06K 13/0806 439/159 |
| 6,074,227 A | * | 6/2000 | Ho ...................... | G06K 13/0825 439/159 |
| 6,570,759 B1 | * | 5/2003 | Chien ................... | G06F 1/1616 361/679.34 |
| 6,619,971 B1 | * | 9/2003 | Chen .................... | G06K 7/0047 439/159 |
| 2021/0153372 A1 | * | 5/2021 | Sung .................... | H05K 7/1409 |

* cited by examiner

*Primary Examiner* — James Wu
*Assistant Examiner* — Hung Q Dang
(74) *Attorney, Agent, or Firm* — Guice Patents PLLC

(57) ABSTRACT

An auxiliary sliding connection assembly, which includes a pair of fixing rails, at least one automatic locking mechanism and a manual unlocking mechanism arranged adjacent to each automatic locking mechanism; the pair of fixing rails have the automatic locking mechanism enabling a locking hole to be automatically locked and arranged corresponding to the locking hole preformed on a second board member, so that a removable unit having the second board member can generate an automatic locking function applied a main frame having a first board member during sliding on the pair of fixing rails, thus a connector of the first board member and a connecting plug of the second board member can be prevented from separating; the manual unlocking mechanism is capable of forming a locked status to each automatic locking mechanism, so that the removable unit can be easily held by a user for being removed.

14 Claims, 18 Drawing Sheets

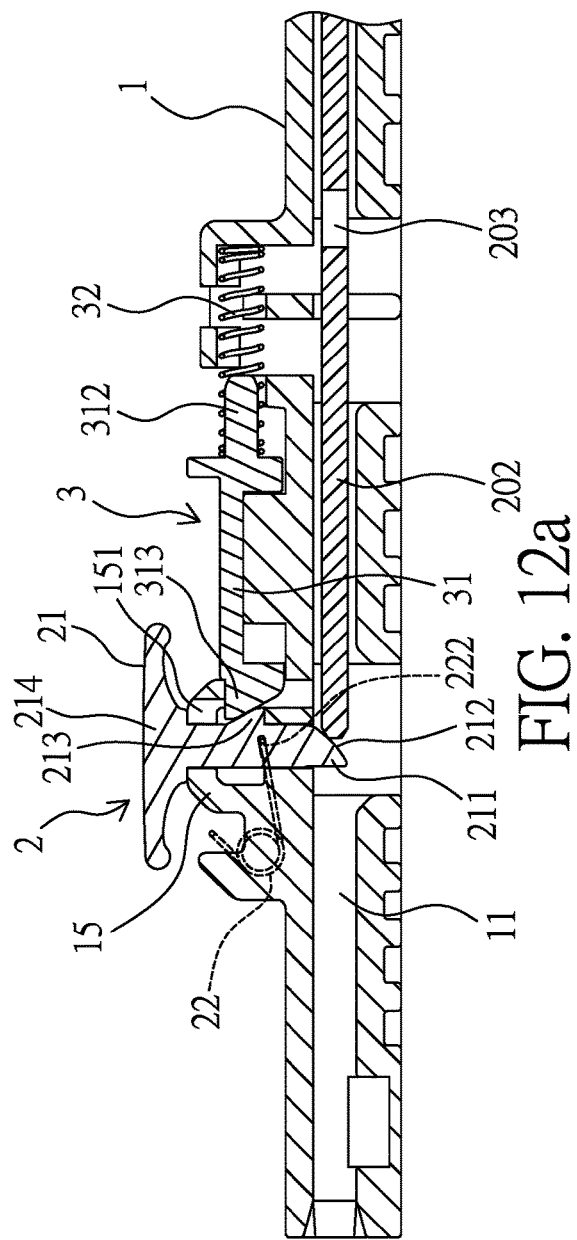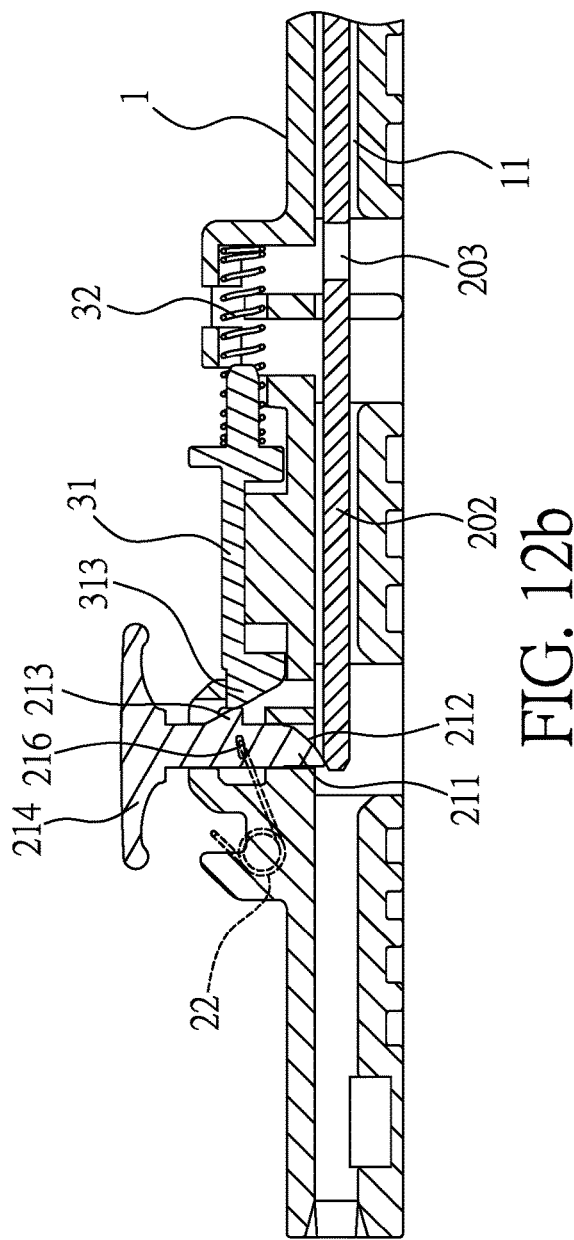

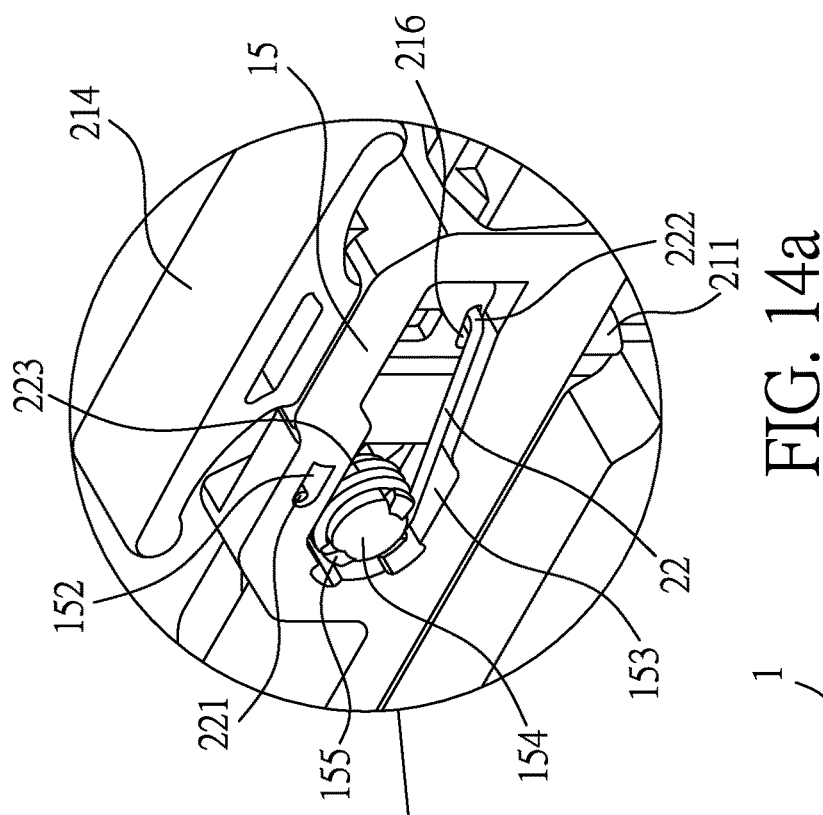
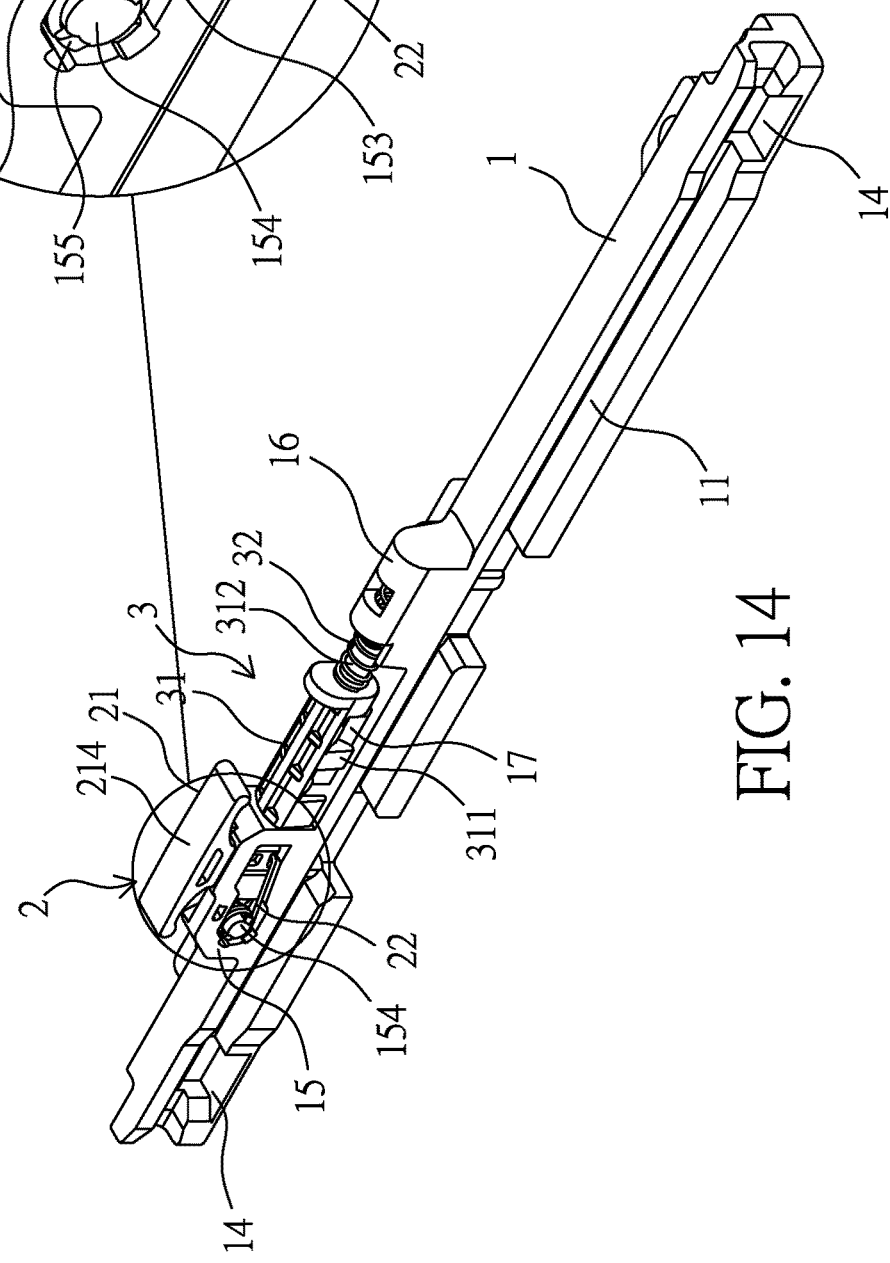
FIG. 14a
FIG. 14

AUXILIARY SLIDING CONNECTION ASSEMBLY

BACKGROUND OF THE INVENTION

1. Field of the Invention

The present invention relates to an auxiliary sliding connection assembly, especially to an auxiliary sliding connection assembly allowing an electronic device, for example a network card to slide, to be connected and locked.

2. Description of Related Art

A sliding rail structure is commonly applied for allowing two electronic devices to be inserted or removed, so that an electrical connection can be established or terminated, and the above-mentioned technical means is a well-known art by the skilled people.

Please refer to FIG. 1, which is a perspective exploded view illustrating a conventional removable electronic device according to a first embodiment. The removable electronic device includes a main frame 10, for example a server, and a removable unit 20, for example a network card. The main frame 10 has a first board member 101, for example a mother board, having a connector 102, and two sides of the connector 102 are oppositely disposed with a pair of fixing rails 103, and each of the fixing rails 103 has a rail slot 104. The removable unit 20 has a second board member 201, for example a circuit board (as shown in FIG. 2), an inner side of the second board member 201 is disposed with a connecting plug (not shown in figures due to the projection angle) at a location corresponding to the connector 102, and two sides thereof are inwardly and oppositely protruded with a pair of sliding rails 202, and each of the sliding rails 202 has a locking hole 203.

When the removable unit 20 is desired to be combined in the main frame 10, the pair of sliding rails 202 are inserted by a user in the pair of rail slots 104 of the pair of fixing rails 103 and inwardly slide along the pair of rail slots 104 till the connecting plug is inserted in the connector 102, thereby forming an electric connection. Please refer to FIG. 2, which discloses an arranging means of the first board member 101 and the second board member 201, in other words the pair of fixing rails 103 are oppositely arranged with an interval on a top surface of the first board member 101, and the second board member 201 is inserted between the pair of fixing rails 103, and located above the first board member 101, so that the second board member 102 is formed in an on-board status relative to the first board member 101.

Please refer to FIG. 3, which is a perspective exploded view illustrating a conventional removable electronic device according to a second embodiment. The removable electronic device includes a main frame 10, for example a server, and a removable unit 20, for example a network card. The main frame 10 has a first board member 101, for example a mother board, the first board member 101 has a rectangular board hole 105, and a connector 102 is disposed at an inner side of the board hole 105, and two sides of the board hole 105 are oppositely disposed with a pair of fixing rails 103, and each of the fixing rails 103 has a rail slot 104. The removable unit 20 has a second board member 201, for example a circuit board (as shown in FIG. 4), an inner side of the second board member 201 is disposed with a connecting plug (not shown in figures due to the projection angle) at a location corresponding to the connector 102, and two sides thereof are inwardly and oppositely protruded with a pair of sliding rails 202, and each of the sliding rails 202 has a locking hole 203.

When the removable unit 20 is desired to be combined in the main frame 10, the pair of sliding rails 202 are inserted by a user in the pair of rail slots 104 of the pair of fixing rails 103 and inwardly slide along the pair of rail slots 104 till the connecting plug is inserted in the connector 102, thereby forming an electric connection. Please refer to FIG. 4, which discloses an arranging means of the first board member 101 and the second board member 201, in other words the pair of fixing rails 103 are oppositely arranged with an interval at two sides of the board hole 105, and the second board member 201 is inserted in the board hole 105 between the pair of fixing rails 103, so that the second board member 201 is formed in an in-board status relative to the first board member 101.

However, the pair of fixing rails 103 disclosed in the two embodiments are not provided with a locking and a positioning function, thus the main frame 10 and the removable unit 20 are connected and fastened only via a holding and clamping force generated between the connector 102 and the connecting plug. When the main frame 10 is in a vibrating environment, the connection between the connector 102 and the connecting plug may be loosened, and the electrical connection is no longer provided; accordingly, the above-mentioned disadvantage shall be improved by the skilled people in the art.

SUMMARY OF THE INVENTION

One primary objective of the present invention is to provide an auxiliary sliding connection assembly, which includes a pair of fixing rails capable of being disposed on a first board member while being in an on-board status or in an in-board status, and at least one of the fixing rails is disposed with an automatic locking mechanism enabling a locking hole to be automatically locked and arranged at a location corresponding to the above-mentioned locking hole preformed on a second board member, and a manual unlocking mechanism capable of forming a manual unlocking status, so that a removable unit, for example a network card, having the second board member, for example a circuit board, is able to generate an automatic locking function applied a main frame, for example a server, having the first board member, for example a mother board, during sliding on the pair of fixing rails, so that the removable unit can be prevented from separating from the main frame, thereby ensuring the stability of an electrical connection.

For achieving said objective, one technical solution provided by the present invention is to provide an auxiliary sliding connection assembly, which includes a pair of fixing rails, at least one automatic locking mechanism and a manual unlocking mechanism arranged adjacent to each automatic locking mechanism; wherein the pair of fixing rails are arranged with an interval and oppositely disposed on a first board member, and inner lateral sides thereof are oppositely and axially formed with a pair of rail slots allowing a pair of sliding rails of a second board member to pass and slide, the pair of fixing rails are provided with a positioning tower having a penetrated slot and allowing the automatic locking mechanism to be disposed and arranged at a location corresponding to a locking hole of each of the sliding rails, and the pair of fixing rails have a stopping member disposed at one side of the positioning tower and arranged with an interval; each of the automatic locking mechanisms has a fastening pin, a latching tenon formed at a bottom end of the fastening pin and capable of passing the penetrated slot and having a guiding surface, a first angular tenon axially protruded at a top end of the latching tenon, a pulling handle disposed at an outer side of the penetrated slot, and an elastic member having a fastening end inserted in the positioning tower and an engaging end inserted in the fastening pin; the latching tenon of each of the automatic locking mechanisms is able to constantly and radially protrude in one of the rail slots via an energy releasing effect provided by the elastic member, so that the guiding surface is oriented towards an inserting direction of the rail slot for automatically locking the locking hole; and each of the manual unlocking mechanisms has a shaft rod and a spring, the spring is disposed in the stopping member and at one end of the shaft rod, a second angular tenon at another end of the shaft rod is able to pass the positioning tower and to be adjacent to the first angular tenon; through upwardly pulling the pulling handle, the latching tenon is able to retract into the penetrated slot, the first angular tenon crosses the second angular tenon for forming an abutting locked status, and the engaging end of the elastic member and the spring are compressed, thereby preventing the fastening pin from automatically falling.

According to one embodiment of the present invention, a lateral piece is radially protruded at a bottom end defined at an outer surface of each of the fixing rails, the lateral piece has at least one screw hole and at least one positioning pin, each of the screw holes is allowed to pass so as to be screwed and connected to a penetrated hole correspondingly formed on the first board member.

According to one embodiment of the present invention, the lateral piece further has at least one positioning pin; wherein each of the positioning pins is inserted in a positioning hole correspondingly formed on the first board member.

According to one embodiment of the present invention, the at least one screw hole and the at least one positioning pin are selectively disposed in a plurality of protruding parts radially protruded from each of the lateral pieces, respectively.

According to one embodiment of the present invention, a front portion and a rear portion defined on a top surface of each of the rail slots are oppositely and respectively formed with a notch.

According to one embodiment of the present invention, a front portion and a rear portion defined at a bottom end of each of the rail slots are respectively formed with a dodging slot.

According to one embodiment of the present invention, the latching tenon is protruded with at least one convex rib at a location opposite to each of outer circumferences of the guiding surface, thereby increasing a connecting tightness with the penetrated slot.

According to one embodiment of the present invention, the guiding surface is an inclined surface or an arc-shaped surface.

According to one embodiment of the present invention, the elastic member is a torsion spring, the fastening end of the torsion spring is inserted in a foot hole of the positioning tower, and the engaging end thereof is inserted in a pin hole of the fastening pin; wherein, the positioning tower is laterally communicated with a spring chamber where the torsion spring is disposed, and a spring column for being sleeved in a plurality of coils of the torsion spring is protruded from the spring chamber.

According to one embodiment of the present invention, an outer circumference of the spring column is protruded with at least two flanges, and each of the flanges has an inclined surface, so that after the coils sleeve with the spring column, the coils are prevented from falling.

According to one embodiment of the present invention, the manual unlocking mechanism further has a supporting member located between the positioning tower and the stopping member, and the supporting member is arranged to be adjacent to the shaft rod.

According to one embodiment of the present invention, the supporting member is a T-shaped or reversed-L-shaped convex rail, and at least one side at a bottom end of the shaft rod has at least one buckle hook allowing the convex rail to be buckled, so that the shaft rod is able to axially move on the supporting member.

According to one embodiment of the present invention, the stopping member is an accommodation chamber allowing the spring to be accommodated, and a supporting shaft at one end of the shaft rod is sleeved with the spring.

According to one embodiment of the present invention, the elastic member is a U-shaped linear spring, the positioning tower has a fastening slot allowing the fastening end of the U-shaped linear spring to be disposed and arranged at an opposite side of the manual unlocking mechanism, the engaging end of the U-shaped linear spring is allowed to pass the positioning tower and inserted in a pair of pin holes oppositely formed on the fastening pin.

BRIEF DESCRIPTION OF THE DRAWINGS

The present invention will be apparent to those skilled in the art by reading the following detailed description of a preferred embodiment thereof, with reference to the attached drawings, in which:

FIG. 12a is a cross sectional view illustrating the auxiliary sliding connection assembly allowing the second board member to be inserted according to the first embodiment of the present invention;

FIG. 12b is a cross sectional view illustrating the auxiliary sliding connection assembly allowing the second board member to slide according to the first embodiment of the present invention;

FIG. 14 is a perspective view illustrating the assembly of the auxiliary sliding connection assembly according to a second embodiment of the present invention;

FIG. 14a is a partially enlarged perspective view illustrating the assembly of the auxiliary sliding connection assembly according to the second embodiment of the present invention;

FIG. 15a is a partially enlarged perspective view illustrating the assembly of the auxiliary sliding connection assembly according to the third embodiment of the present invention;

DETAILED DESCRIPTION OF THE PREFERRED EMBODIMENT

Figure 1:
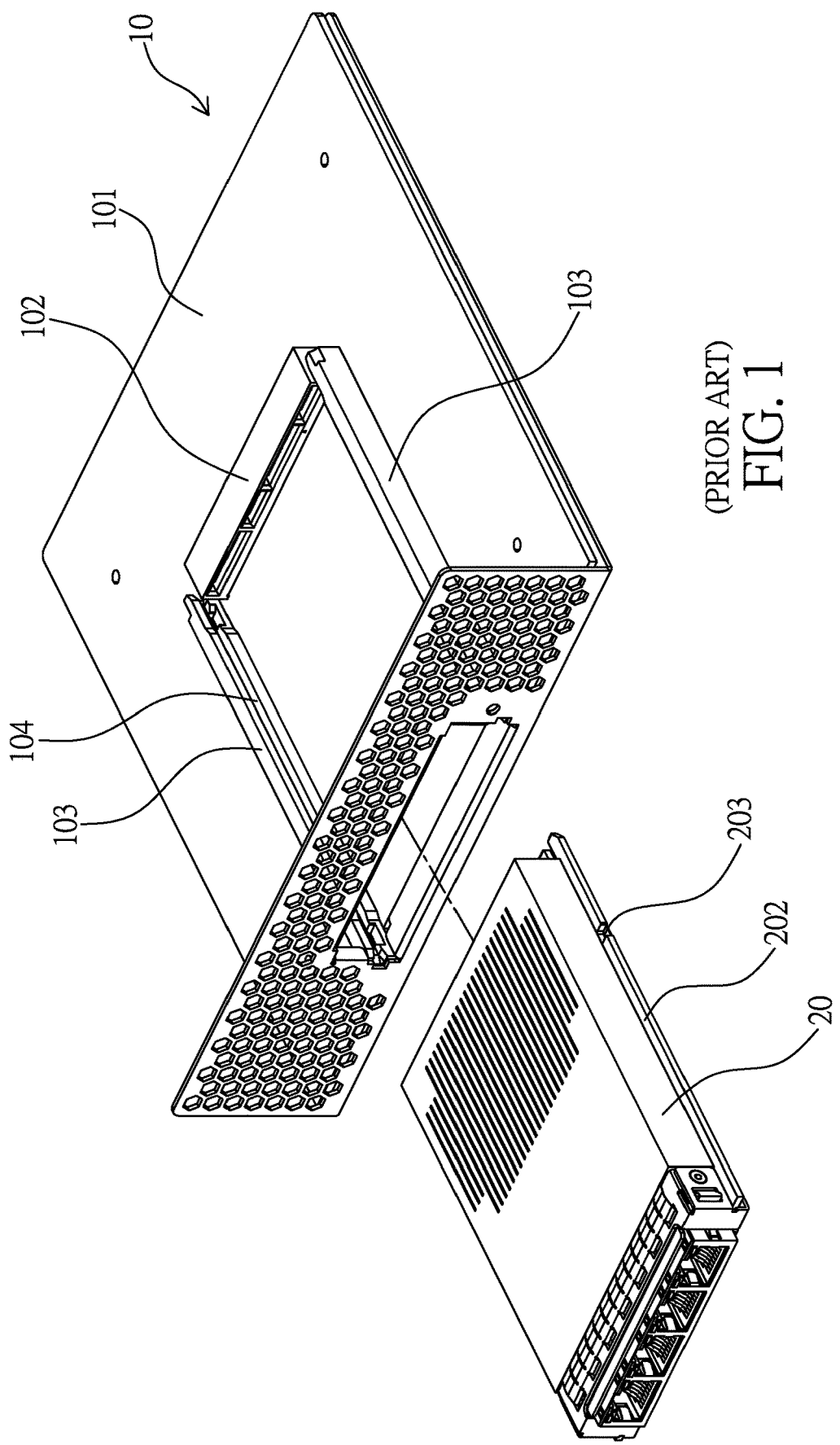
FIG. 1 is a perspective exploded view illustrating a conventional removable electronic device according to a first embodiment.
Figure 2:
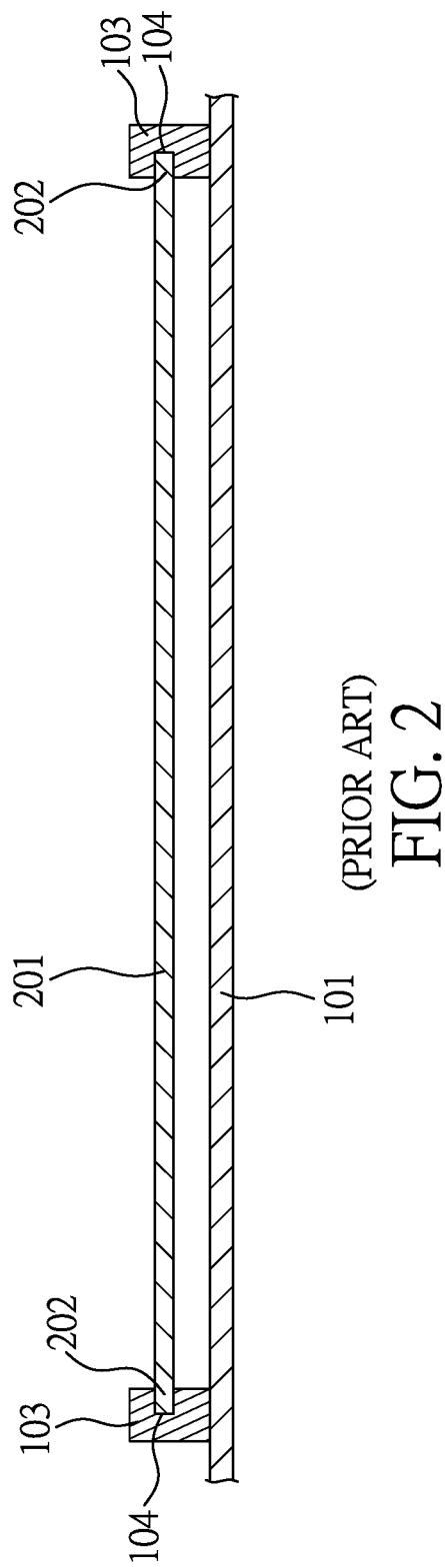
FIG. 2 is a schematic view illustrating the second board member being formed with an on-board status relative to the first board member of FIG. 1.
Figure 3:
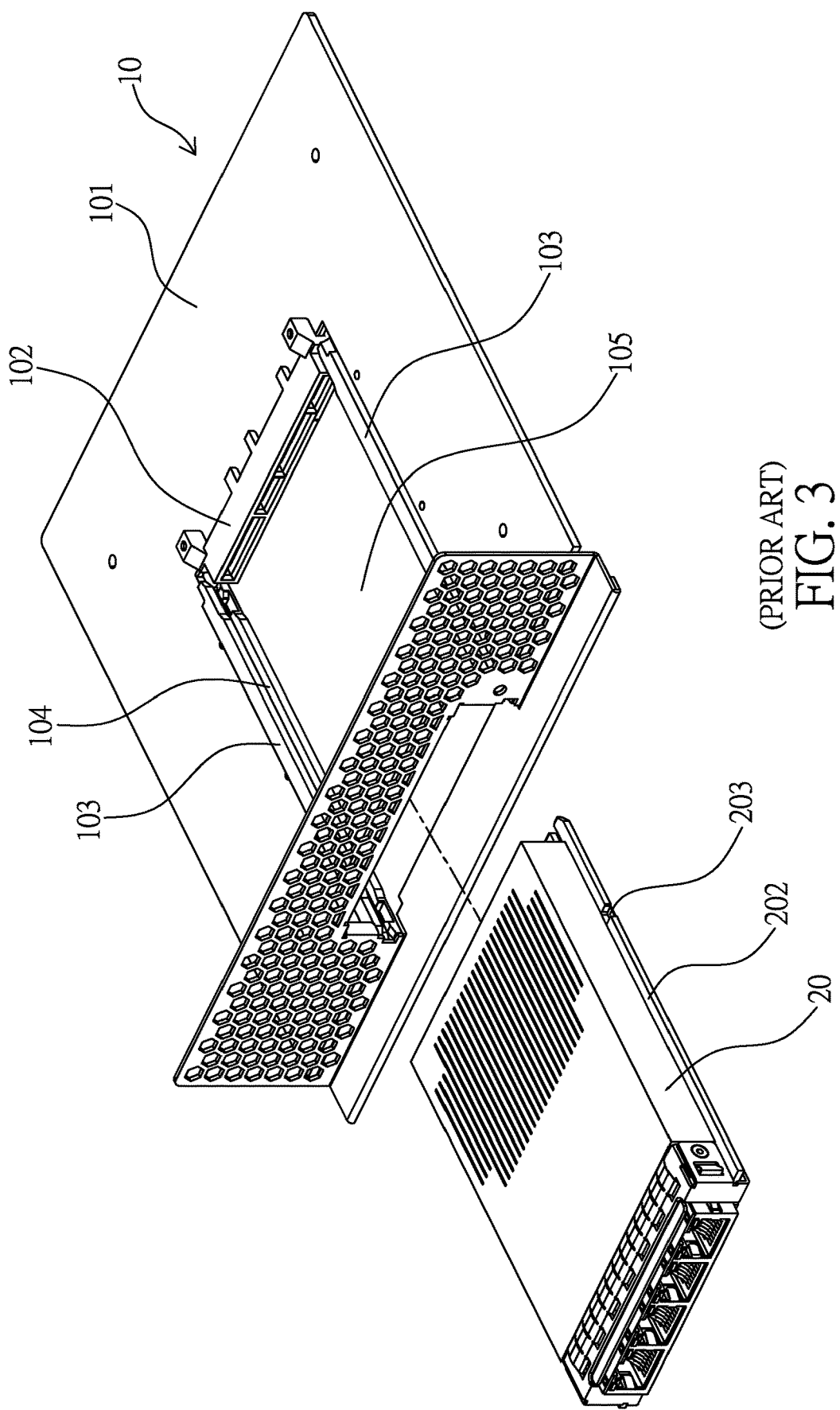
FIG. 3 is a perspective exploded view illustrating a conventional removable electronic device according to a second embodiment.
Figure 4:
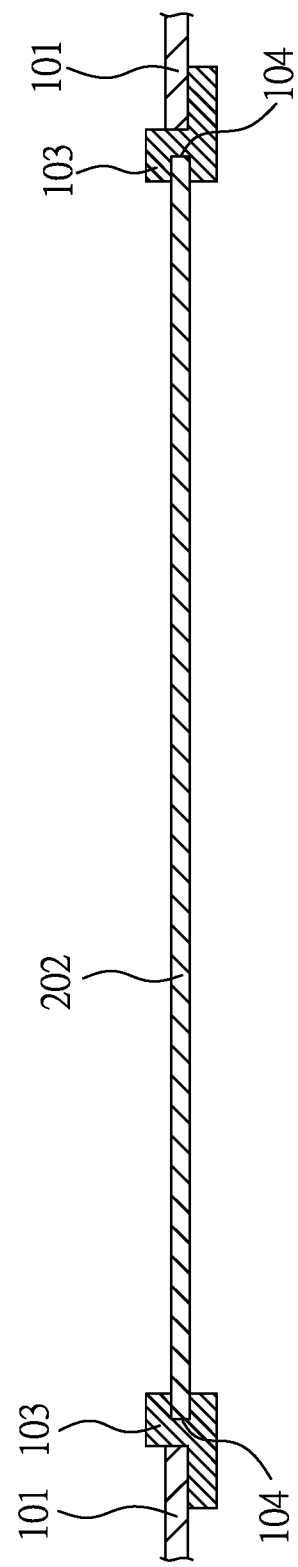
FIG. 4 is a schematic view illustrating the second board member being formed with an in-board status relative to the first board member of FIG. 3.
Figure 5:
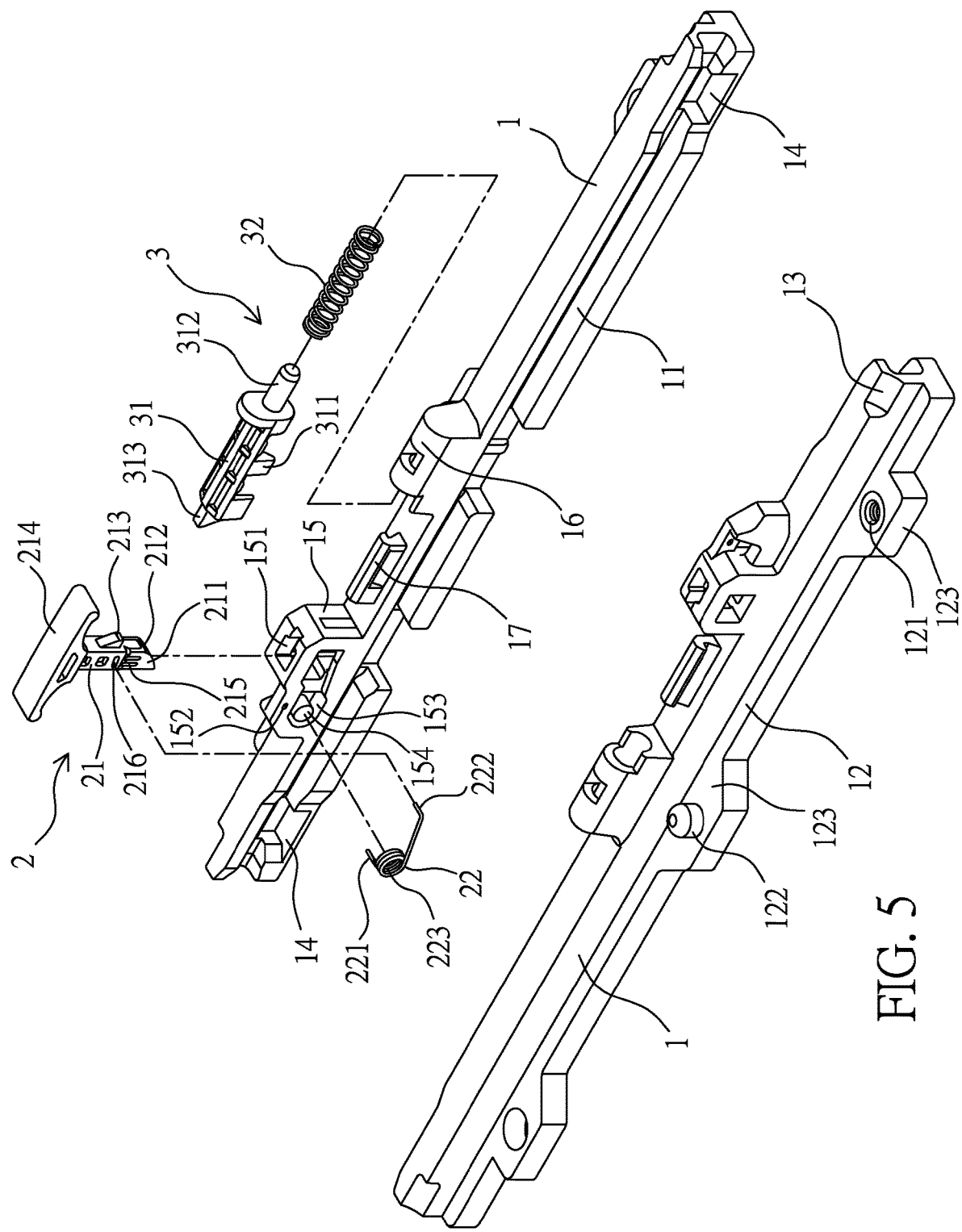
FIG. 5 is a perspective exploded view illustrating an auxiliary sliding connection assembly according to a first embodiment of the present invention.
Figure 6:
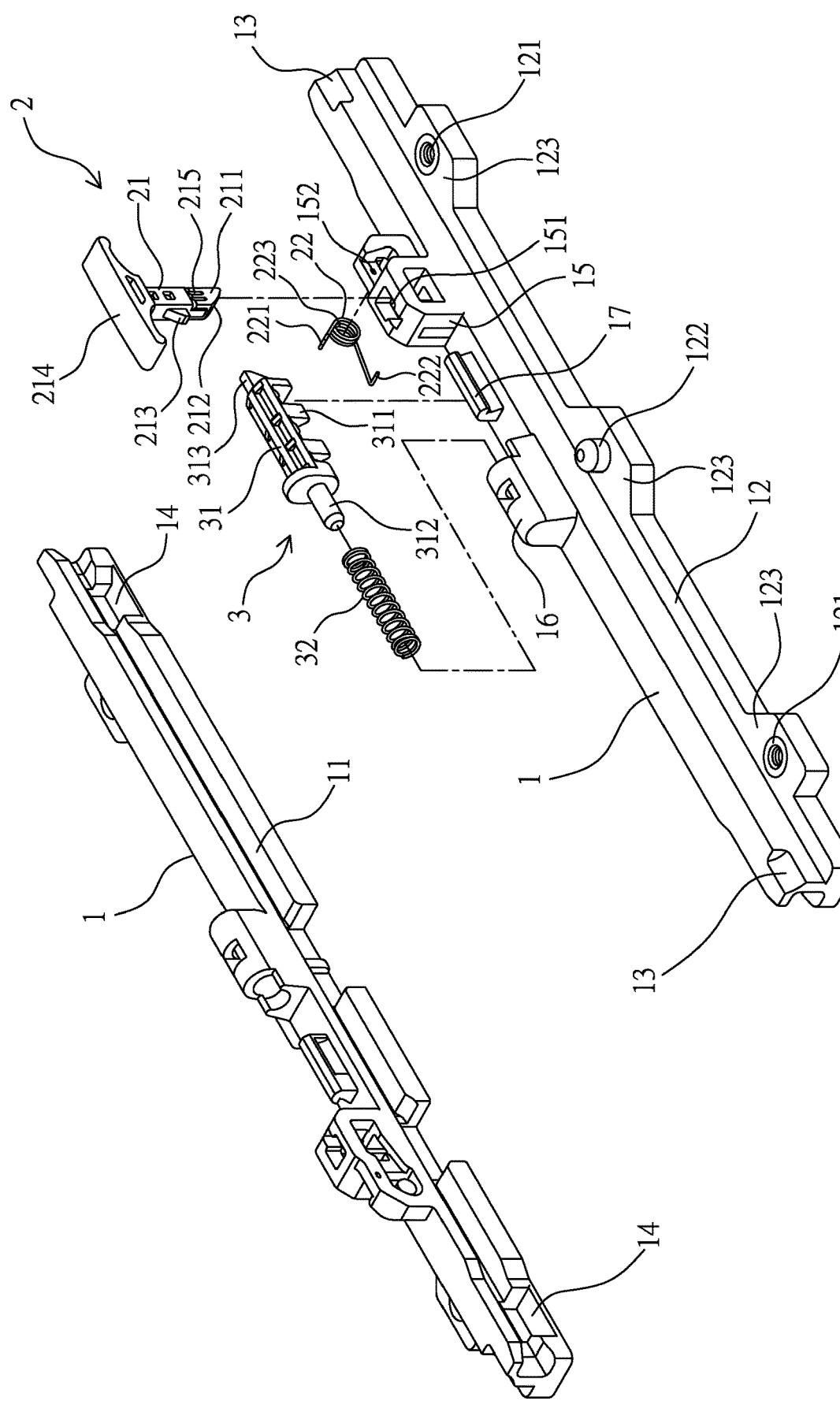
FIG. 6 is another perspective exploded view illustrating the auxiliary sliding connection assembly according to the first embodiment of the present invention.
Figure 7:
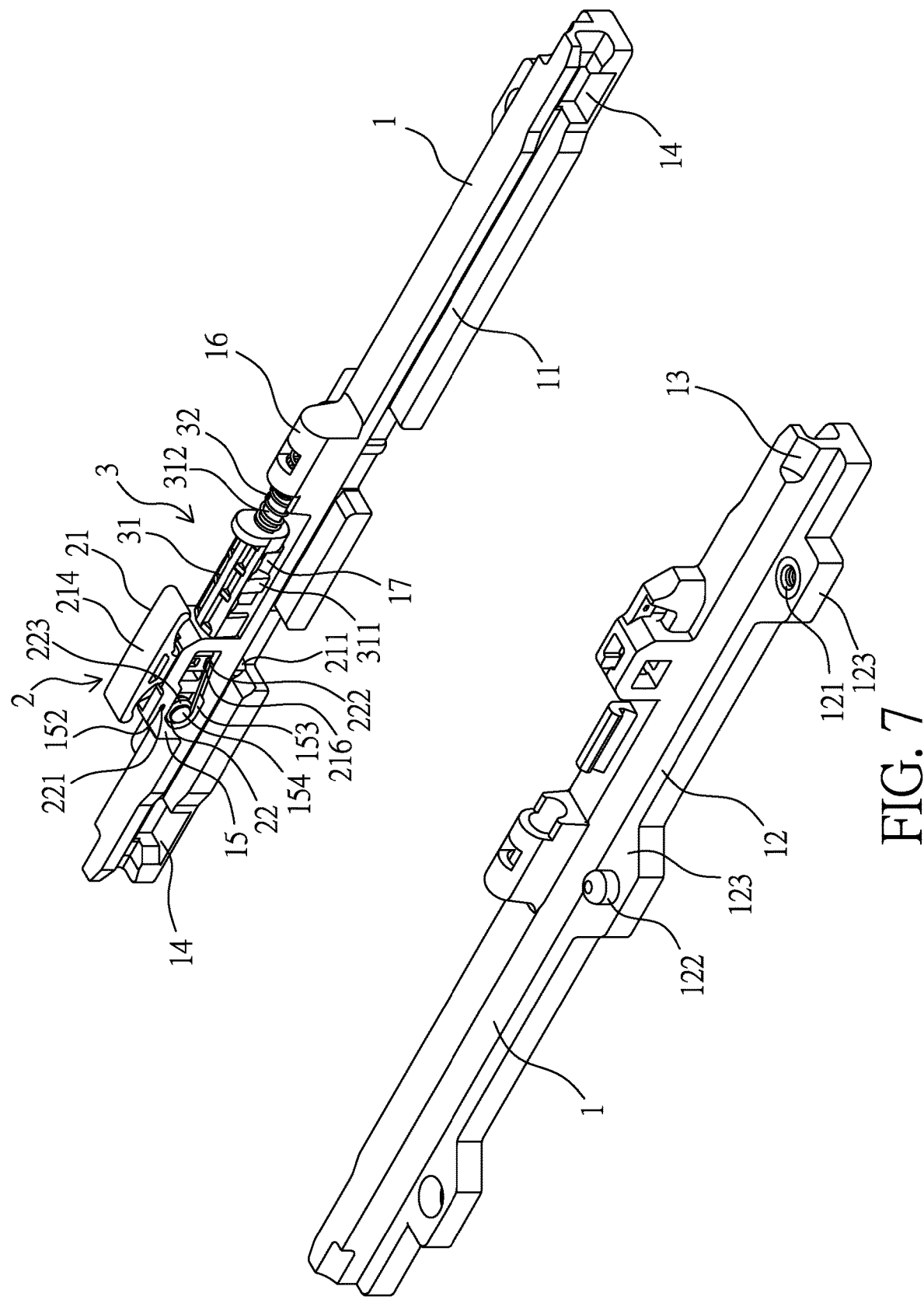
FIG. 7 is a perspective view illustrating the assembly of the auxiliary sliding connection assembly according to the first embodiment of the present invention.

Please refer from FIG. 5 to FIG. 7 and according to the first embodiment of the present invention, an auxiliary sliding connection assembly is disclosed. The auxiliary sliding connection assembly is an insulation body integrally formed with a plastic material being processed with an injection molding means, and includes a pair of fixing rails 1, at least one automatic locking mechanism 2 and a manual unlocking mechanism 3 arranged adjacent to each automatic locking mechanism 2.

Figure 9:
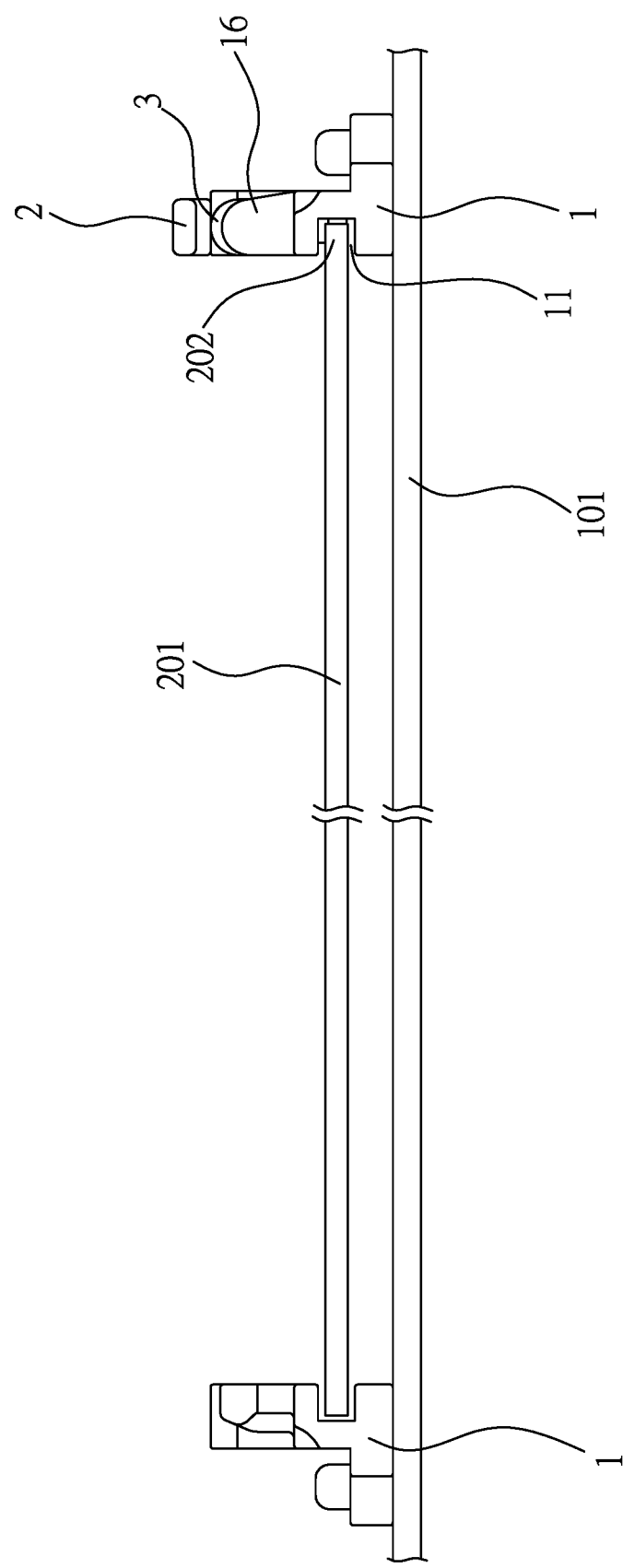
FIG. 9 is a schematic view illustrating the second board member being formed with the on-board status relative to the first board member of FIG. 8.
Figure 10:
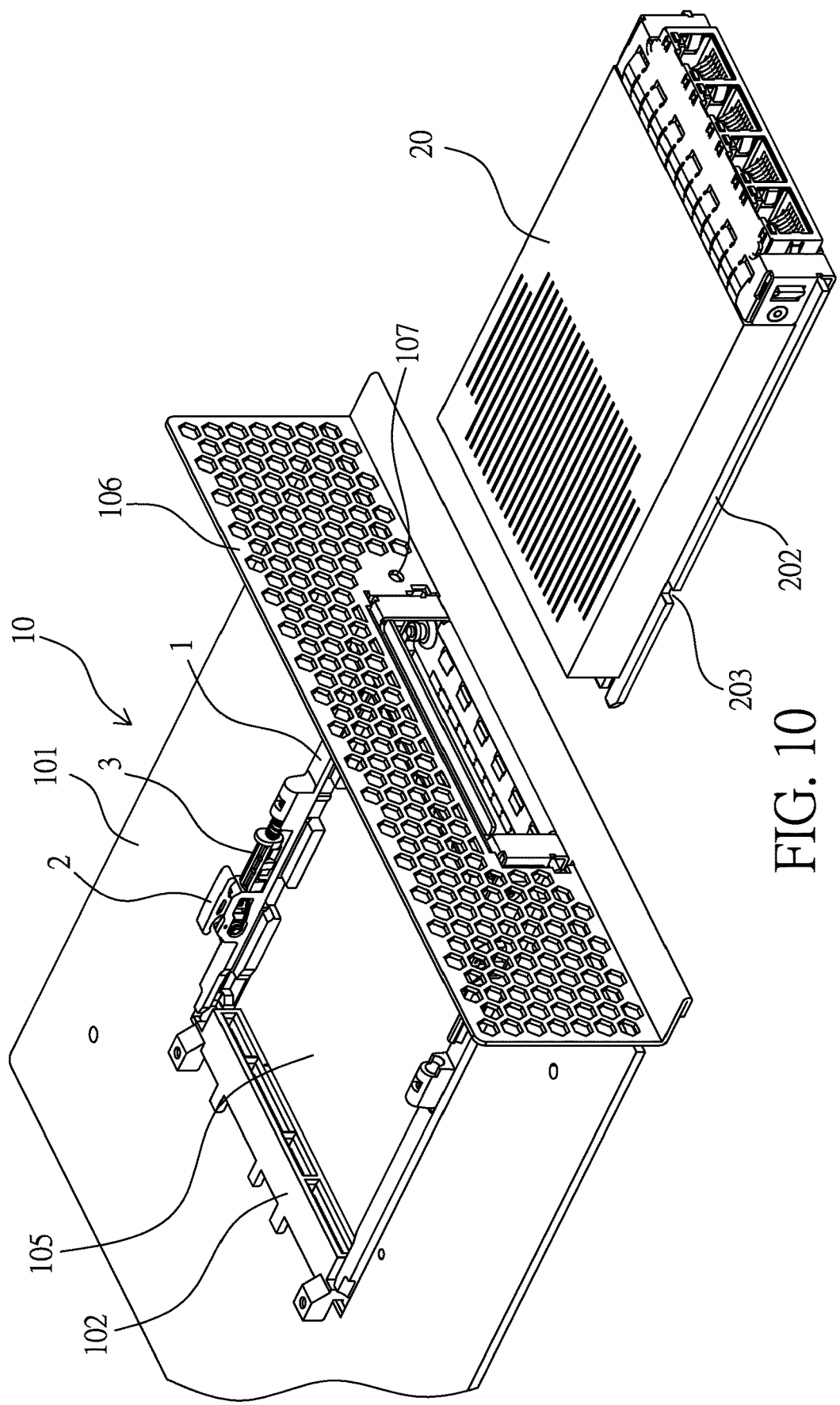
FIG. 10 is a perspective exploded view illustrating the auxiliary sliding connection assembly being applied in the removable electronic device with an in-board status according to the first embodiment of the present invention.
Figure 11:
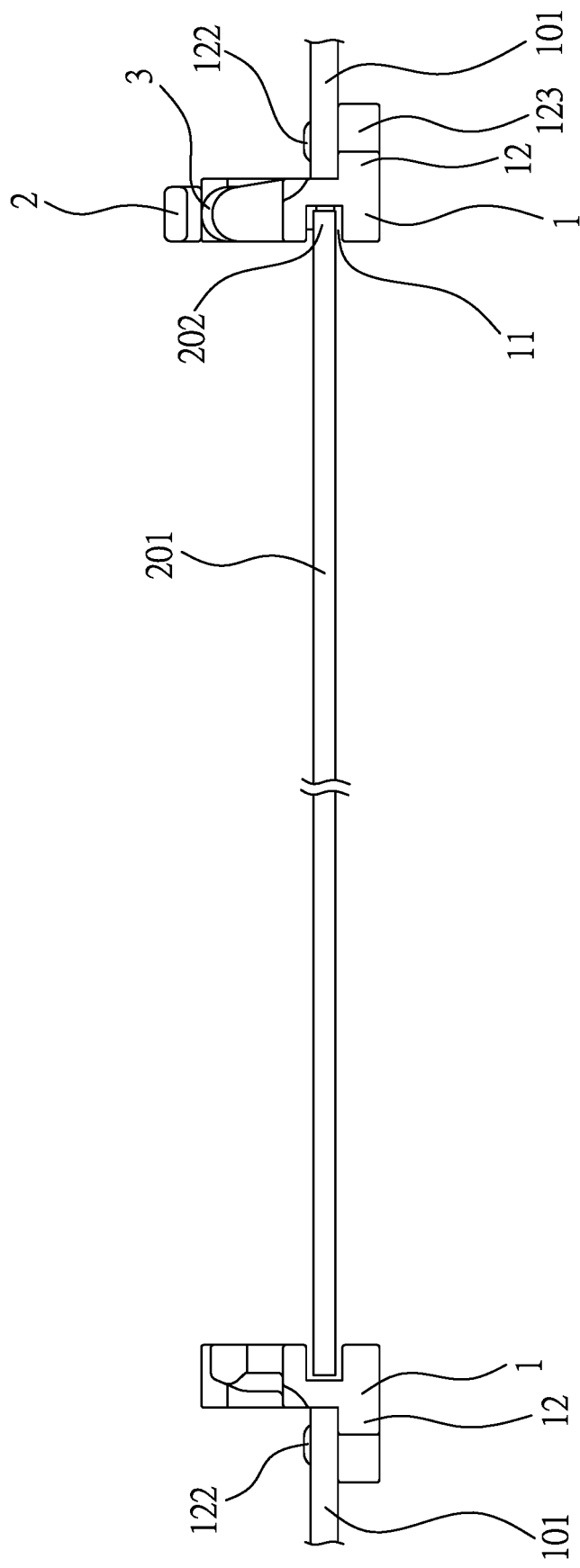
FIG. 11 is a schematic view illustrating the second board member being formed with the in-board status relative to the first board member of FIG. 10.

The pair of fixing rails 1 are oppositely disposed with an interval, and inner lateral sides thereof are oppositely and axially formed with a rail slot 11, respectively; according to this embodiment, the shape of each of fixing rails 1 is completely the same, one of the fixing rails 1 is oppositely arranged with the other fixing rail 1 which is rotated 180 degrees, thereby achieving the arrangement of the pair of fixing rails 1, so that an expenditure for preparing another mold for the other fixing rail 1 can be saved. Wherein, a lateral piece 12 is radially protruded at a bottom end defined at an outer surface of each of the fixing rails 1, the installation of the lateral piece 12 is to allow the lateral piece 12 to be directly disposed on a first board member 101 (as shown in FIG. 8 and FIG. 9), for example a mother board, of a main frame 10 of a removable electronic device, thereby forming an on-board status; or the lateral piece 12 is abutted against an inner bottom surface (as shown in FIG. 10 and FIG. 11) of a rectangular sheet hole 105 preformed on the first board member 101 of the main frame 10, thereby forming an in-board status.

As shown in FIG. 5, the lateral piece 12 has at least one screw hole 121 and at least one positioning pin 122, each screw hole 121 allows a convention screwing member, for example a screw, to pass so as to be screwed and connected to a penetrated hole preformed on the first board member 101, and each positioning pin 122 is inserted in a positioning hole preformed on the first board member 101 while being in the in-board status. Wherein, the at least one screw hole 121 and the at least one positioning pin 122 are selectively disposed in a plurality of protruding parts 123 radially protruded from the lateral piece 12, respectively. As shown in FIG. 5, there are two screw holes 121, which are disposed at a front portion and a rear portion of the protruding part 123, respectively, and there is one positioning pin 122, which is disposed at a middle portion of the protruding part 123.

Figure 8:
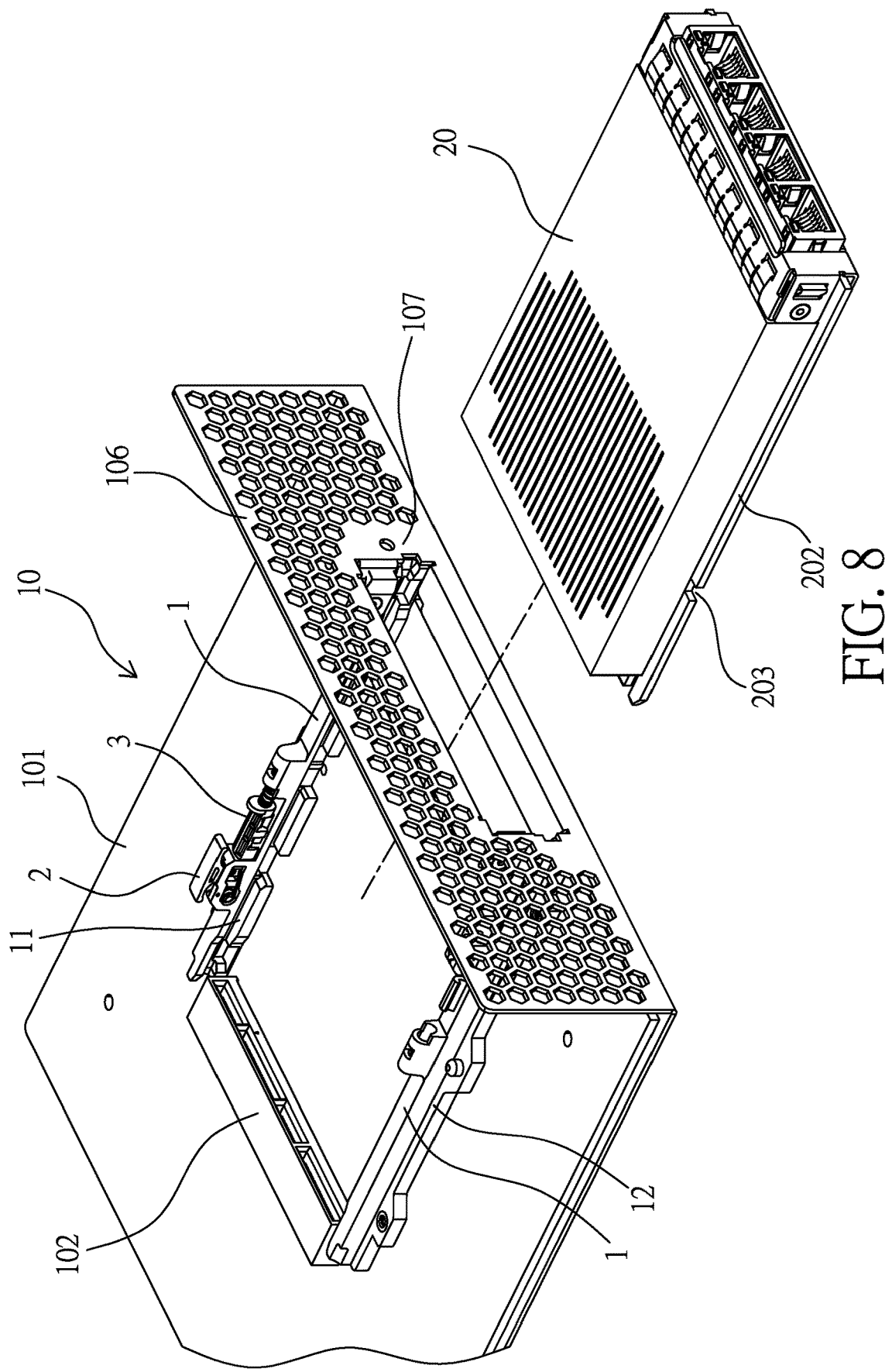
FIG. 8 is a perspective exploded view illustrating the auxiliary sliding connection assembly being applied in the removable electronic device with an on-board status according to the first embodiment of the present invention.

Moreover, a front portion and a rear portion defined on a top surface of the rail slot 11 are oppositely and respectively formed with a notch 13; please refer to FIG. 8, a panel 106 disposed at a front end of the first board member 101 is preformed with a screw hole 107, the screw hole 107 allows an manually-rotated screw to be received, and to be screwed and connected to a fastening hole (known as a convention art and not provided with a code) correspondingly formed at a lateral side of a removable unit 20, for example a network card, thus a part of the manually-rotated screw can be accommodated in the notch 13.

Moreover, a front portion and a rear portion defined at a bottom end of the rail slot 11 are respectively formed with a dodging slot 14, a main function of the dodging slot 14 is to allow a retracting board member (known as a conventional art and not provided with a code) of the removable unit 20 to be provided with a dodging space.

Furthermore, one of the fixing rails 1 has a positioning tower 15 allowing the automatic locking mechanism 2 to be disposed thereon, and being arranged at a location corresponding to a locking hole 203 formed on a pair of sliding rails 202 at a bottom end of the removable unit 20, the positioning tower 15 has a penetrated slot 151 communicated with the rail slot 11. For allowing the manual unlocking mechanism 3 to be disposed, a stopping member 16, for example an accommodation chamber, and a supporting member 17, for example a convex rail, are disposed at one side of the positioning tower 15 and arranged with an interval; wherein, the supporting member 17 is located between the positioning tower 15 and the stopping member 16.

The automatic locking mechanism 2 has a fastening pin 21 received in the penetrated slot 151, a latching tenon 211 capable of passing the penetrated slot 151 and protruding into the rail slot 11 and having a guiding surface 212 is formed at a bottom end of the fastening pin 21, a first angular tenon 213 is axially protruded at a top end of the latching tenon 211, and a pulling handle 214 is disposed at an outer side of the penetrated slot 151. Wherein, each outer circumference of the latching tenon 211 is protruded with at least one convex rib 215 except the guiding surface 212, the arrangement of the convex ribs 215 is to increase the connecting tightness with the penetrated slot 151, thereby preventing a shaking situation from occurring.

Please refer to FIG. 5, FIG. 6 and FIG. 12, the guiding surface 212 is an inclined surface in actual practice. According to another embodiment of the present invention, the guiding surface 212 can be an arc-shaped surface.

The automatic locking mechanism 2 further has an elastic member 22; according to this embodiment, the elastic member 22 is a torsion spring, one fastening end 221 of the torsion spring is inserted in a foot hole 152 of the positioning tower 15, and an engaging end 222 thereof is inserted in a pin hole 216 of the fastening pin 21. Wherein, the positioning tower 15 is laterally communicated with a spring chamber 153 where the elastic member 22 is disposed, and a spring column 154 for being sleeved in a plurality of coils 223 of the elastic member 22 is protruded from the spring chamber 153.

Figure 13:
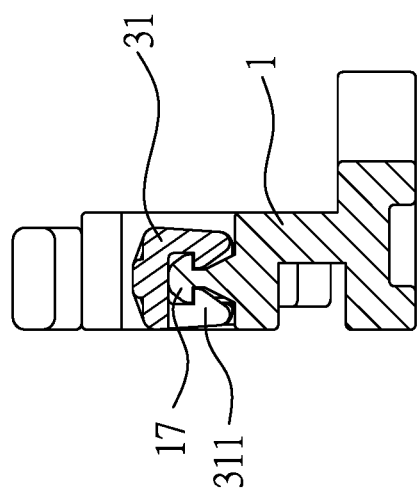
FIG. 13 is a cross sectional view illustrating the manual unlocking mechanism and the fixing rail according to the present invention.

Moreover, the manual unlocking mechanism 3 has a shaft rod 31 and a spring 32. Please refer to FIG. 13, the supporting member 17 is a T-shaped or reversed-L-shaped convex rail in actual practice, and at least one side at a bottom end of the shaft rod 31 has at least one buckle hook 311 allowing the supporting member 17 to be buckled, so that the shaft rod 31 is able to axially move on the supporting member 17, the spring 32 is disposed in the stopping member 16, for example the accommodation chamber, and a supporting shaft 312 at one end of the shaft rod 31 is sleeved with the spring 32, a second angular tenon 313 at another end of the shaft rod 31 is allowed to pass the positioning tower 15 and arranged to be adjacent to the first angular tenon 213.

Please refer to FIG. 12a, which is a cross sectional view illustrating the automatic locking mechanism 2 is disposed on the positioning tower 15; the latching tenon 211 is able to constantly and radially protrude from the penetrated slot 151 via a stretching effect provided by the elastic member 22, so that the guiding surface 212 can be oriented towards an inserting direction of the rail slot 11.

Please refer to FIG. 8 and FIG. 9, which disclose the pair of fixing rails 1 being arranged with an interval and fastened on the first board member 101, for example the mother board, of the main frame 10 for forming the on-board status, the pair of fixing rails 1 allow the removable unit 20, for example the network card, to be inserted or removed, and the first board member 101 has a connector 102 disposed at a distal end of the pair of fixing rails 1. The removable unit 20 has a second board member 201, for example a circuit board (as shown in FIG. 9), and an inner side of the second board member 201 has a connecting plug (not shown in figures due to the projection angle) arranged at a location corresponding to the connector 102.

Figure 12C:
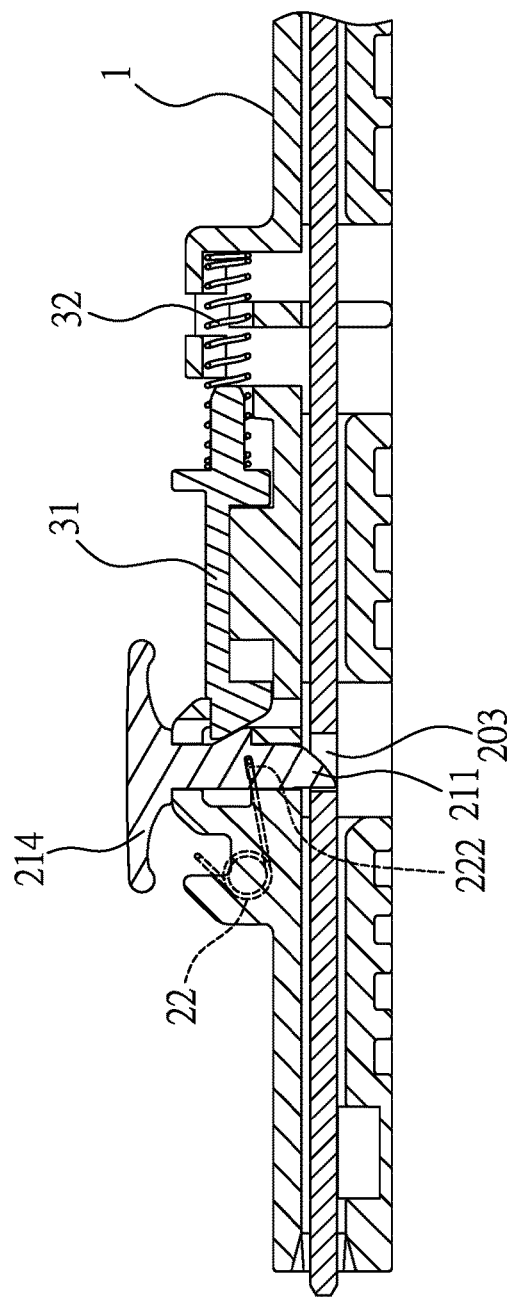
FIG. 12c is a cross sectional view illustrating the auxiliary sliding connection assembly allowing the second board member to be automatically locked according to the first embodiment of the present invention.

Please refer from FIG. 12a to FIG. 12c, which show a means of the removable unit 20 being inserted in the main frame 10, the pair of sliding rails 202 are inserted in the pair of rail slots 11 of the pair of fixing rails 1, so that each of the sliding rails 202 is able to inwardly slide along the corresponding rail slot 11, when the sliding rail 202 is in contact with the guiding surface 212 of the latching tenon 211, the latching tenon 211 is able to upwardly move, and the first angular tenon 213 upwardly displaces along the second angular tenon 313, meanwhile the engaging end 222 of the elastic member 22 and the spring 32 are compressed (as shown in FIG. 12a and FIG. 12b). Then, the sliding rail 202 inwardly move along a corner defined at the bottom end of the latching tenon 211 till the locking hole 203 displaces to be below the latching tenon 211, the engaging end 222 is in a stretched status, so that the latching tenon 211 is buckled in the locking hole 203, thereby forming an automatic locking function (as shown in FIG. 12c). At this moment, a connecting plug (known as a prior art and not provided with a code) at a back surface of the removable unit 20 is inserted in the connector 102 so as to form an electrical connection, and the automatic locking mechanism 2 is inserted and locked in the locking hole 203, so that the removable unit 20 can be prevented from separating from the main frame 10 when the removable unit 2 is in a vibrating environment.

Figure 12D:
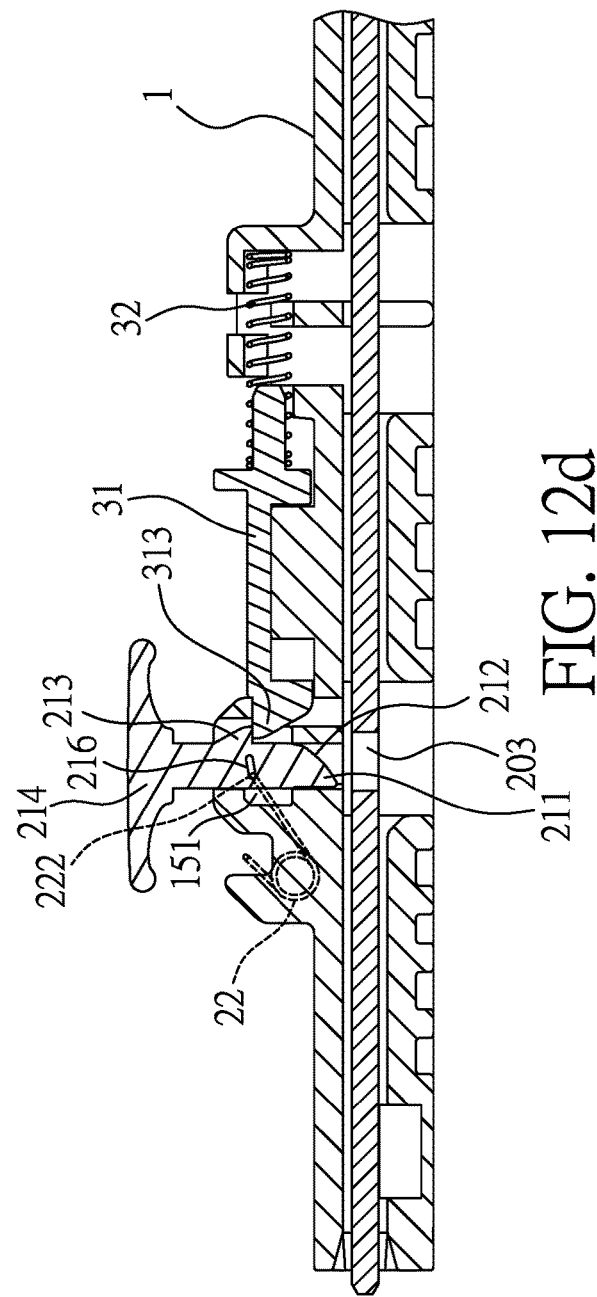
FIG. 12d is a cross sectional view illustrating the auxiliary sliding connection assembly allowing the second board member to be manually unlocked according to the first embodiment of the present invention.

When the removable unit 20 is desired to be unlocked and outwardly pulled for being removed, the pulling handle 214 is held and upwardly pulled by a user, so that the latching tenon 211 retracts into the penetrated slot 151, at this moment the first angular tenon 213 crosses the second angular tenon 313 for forming an abutting locked status, and the engaging end 222 of the elastic member 22 and the spring 32 are compressed, thereby preventing the fastening pin 21 from automatically falling (as shown in FIG. 12d). And then, the removable unit 20 is held by the user for being outwardly pulled, thus the connecting plug is separated from the connector 102, thereby allowing the removable unit 20 to be removed from the main frame 10.

When the automatic locking mechanism 2 is desired to be provided with the automatic locking function again, the shaft rod 31 is axially and outwardly pushed by the user, the spring 32 is compressed, so that the second angular tenon 313 is released from the first angular tenon 213 so as to unlock the fastening pin 21, thereby allowing the fastening pin 21 to be recovered to a status as shown in FIG. 12a.

Please refer to FIG. 10 and FIG. 11, which disclose the pair of fixing rails 1 being fixed with an interval at two inner lateral sides of a board hole 105 preformed on the first board member 101, the mother board, of the main frame 10, thereby forming the in-board status. The pair of fixing rails 1 allows the removable unit 20, for example the network card, to be inserted or removed, and the connector 102 is disposed in the board hole 105 of the first board member 101 and the distal end of the pair of fixing rails 1. The means of the removable unit 20 being inserted in the main frame 10 is the same as the on-board status, therefore no further illustration is provided. Accordingly, when the pair of fixing rail 1 is in the in-board status, the removable unit 20 can also be prevented from separating from the main frame 10 when the removable unit 20 is in the vibrating environment.

Please refer to FIG. 14 and FIG. 14a, which disclose the second embodiment of the auxiliary sliding connection assembly provided by the present invention, the same codes (marks) shared by the second embodiment and the first embodiment are defined as the same components, because there are a lot of components shared by the second embodiment and the first embodiment, only the differences between the second embodiment and the first embodiment are provided as follows.

According to the second embodiment, there is only one fixing rail 1 disclosed for a purpose of to be easily understood; the differences between the second embodiment and the first embodiment are that: an outer circumference of the spring column 154 is protruded with at least two flanges 155, and each of the flanges 155 has an inclined surface, so that after the coils 223 of the elastic member 22 sleeve with the spring column 154, the coils 223 can be prevented from falling, and the elastic member 22 can be provided with an excellent fastening effect.

Figure 15:
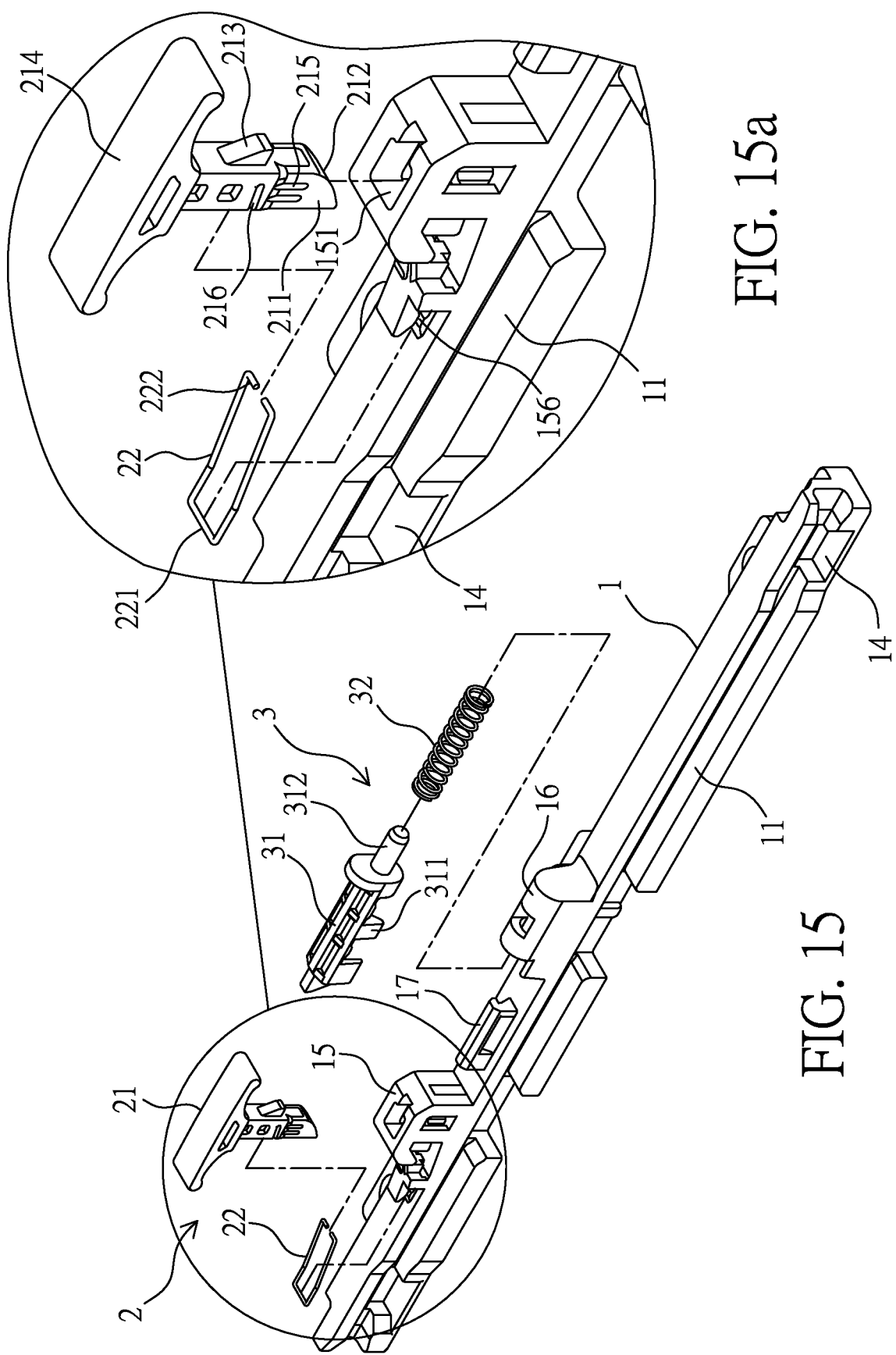
FIG. 15 is a perspective exploded view illustrating the auxiliary sliding connection assembly according to a third embodiment of the present invention.

Please refer to FIG. 15 and FIG. 15a, which disclose the third embodiment of the auxiliary sliding connection assembly provided by the present invention, the same codes (marks) shared by the third embodiment and the first embodiment are defined as the same components, because there are a lot of components shared by the third embodiment and the first embodiment, only the differences between the third embodiment and the first embodiment are provided as follows.

Figure 16:
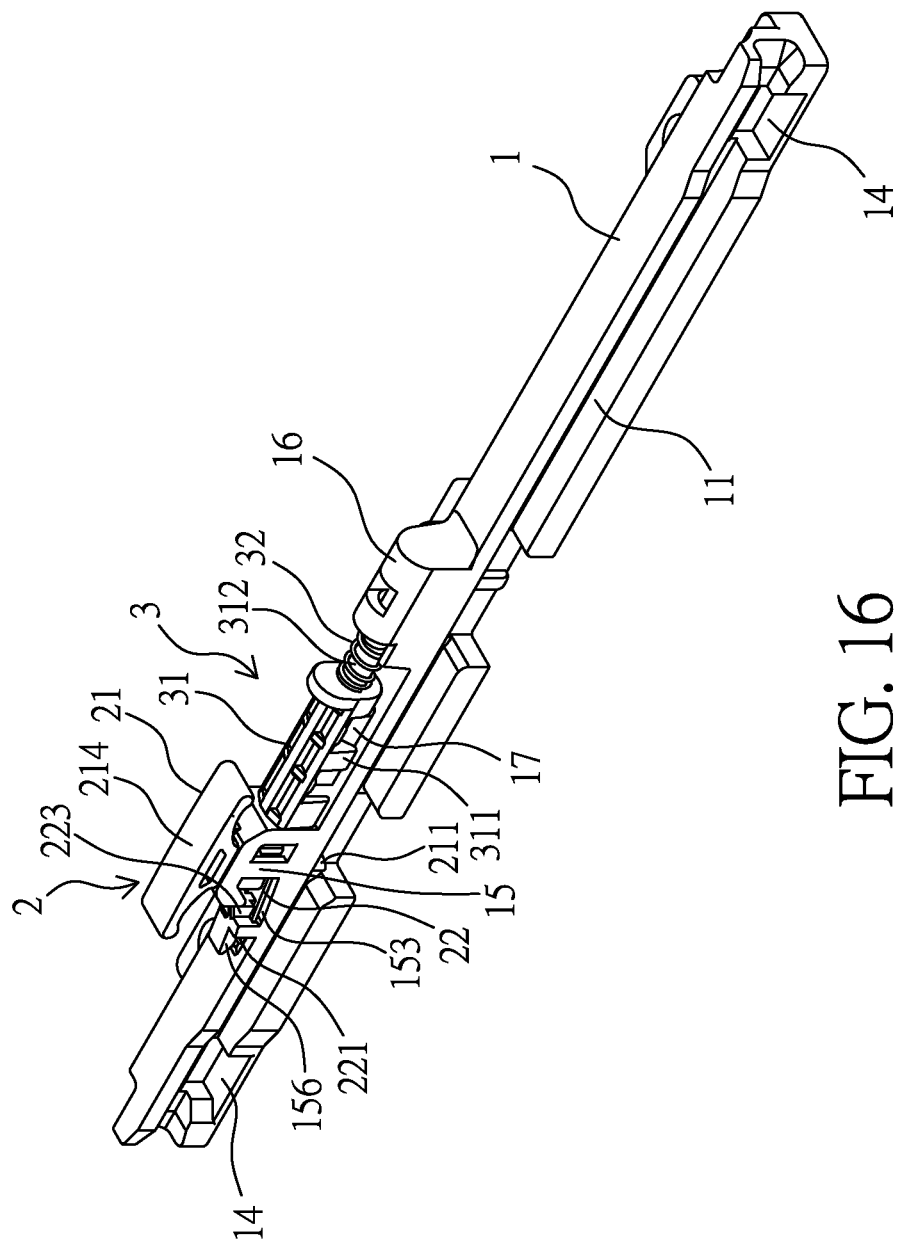
FIG. 16 is a perspective view illustrating the assembly of the auxiliary sliding connection assembly according to the third embodiment of the present invention.

According to the third embodiment, there is only one fixing rail 1 disclosed for a purpose of to be easily understood; the differences between the third embodiment and the first embodiment are that: a U-shaped linear spring is adopted as the elastic member 22 so as to replace the torsion spring, the U-shaped linear spring also has the fastening end 221 and the engaging end 222. The positioning tower 15 has a fastening slot 156 allowing the fastening end 221 to be disposed and arranged at an opposite side of the manual unlocking mechanism 3, the engaging end 222 is allowed to pass the positioning tower 15 and inserted in a pair of pin holes 216 oppositely formed on the fastening pin 21, thereby finishing an assembling procedure of the elastic member 22 being disposed on the positioning tower 15 and the fastening pin 21 as shown in FIG. 16.

Figure 17:
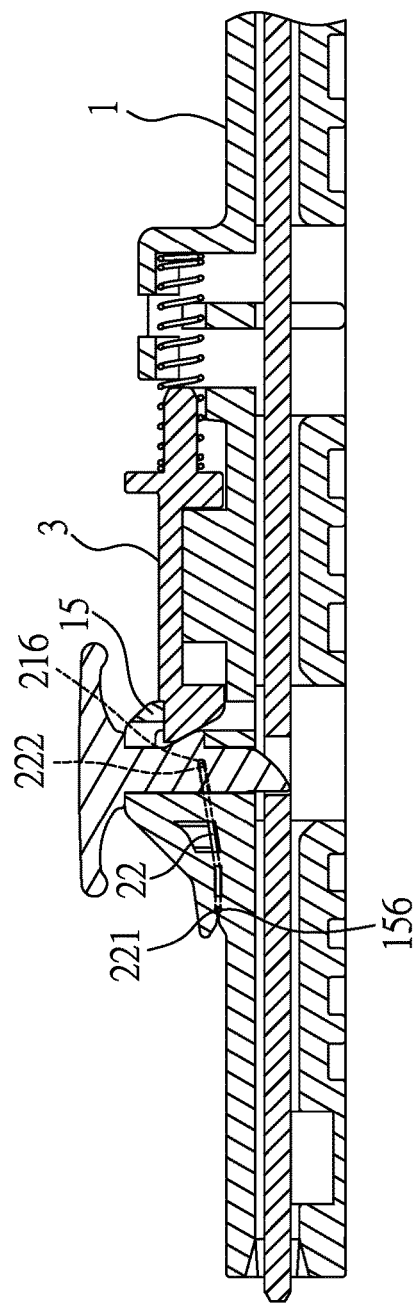
FIG. 17 is a cross sectional view illustrating the auxiliary sliding connection assembly being formed in an automatic locked status according to the third embodiment of the present invention.
Figure 18:
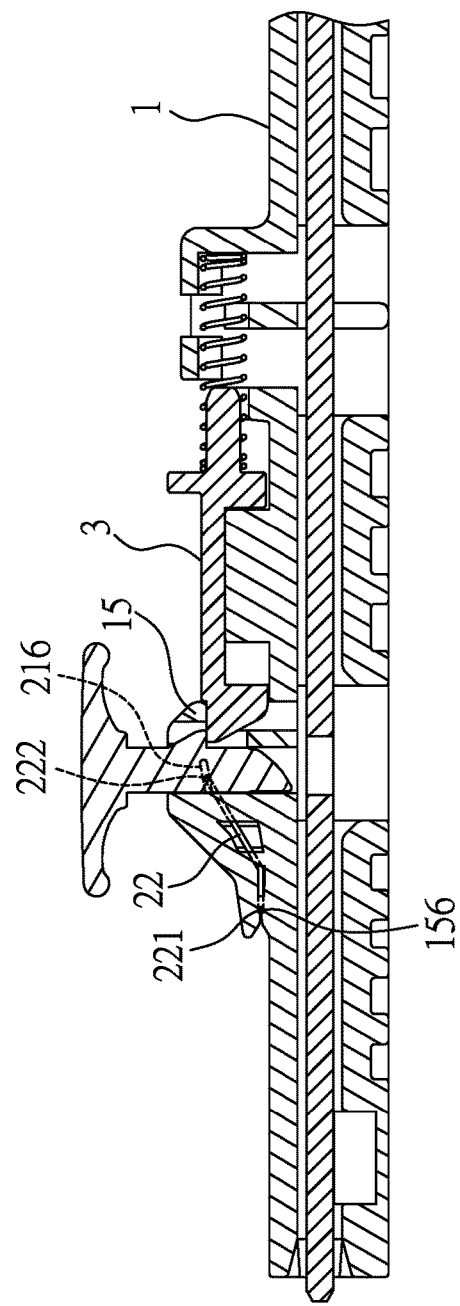
FIG. 18 is a cross sectional view illustrating the auxiliary sliding connection assembly being formed in a manual unlocked status according to the third embodiment of the present invention.

Please refer to FIG. 17 and FIG. 18, which are cross sectional views respectively illustrating the elastic member 22, for example the U-shaped linear spring, being in an automatic locking status and in a manual unlocking status. As shown in figures, it is clearly to be understood that the U-shaped linear spring and the torsion spring are both provided with effects of energy storing and energy releasing, and an anticipated automatic locking function can be provided.

Based on what has been disclosed above, advantages achieved by the present invention are as follows. The pair of fixing rails of the auxiliary sliding connection assembly are formed with the on-board status or the in-board status on the first board member with different statuses, and the at least one fixing rail has the automatic locking mechanism enabling the locking hole to be automatically locked and arranged at the location corresponding to the locking hole preformed on the second board member, so that the removable unit, for example the network card, having the second board member, for example the circuit board, is able to generate the automatic locking function applied the main frame, for example a server, having the first board member, for example the mother board, during sliding on the pair of fixing rails, so that the connector of the first board member and the connecting plug of the second board member can be prevented from separating, thereby ensuring the stability of the electrical connection. Moreover, the auxiliary sliding connection assembly further has the manual unlocking mechanism capable of forming a locked status to the automatic locking mechanism, so that the removable unit can be easily held by the user for being processed with a removing and separating operation. Accordingly, the auxiliary sliding connection assembly is novel and more practical in use comparing to prior art.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific examples of the embodiments disclosed and that modifications and other embodiments are intended to be included within the scope of the appended claims. Although specific terms are employed herein, they are used in a generic and descriptive sense only and not for purposes of limitation.

What is claimed is:

1. An auxiliary sliding connection assembly, including:
   a pair of fixing rails, at least one automatic locking mechanism and a manual unlocking mechanism arranged adjacent to each of said automatic locking mechanisms; wherein said pair of fixing rails are arranged with an interval and oppositely disposed on a first board member, and inner lateral sides thereof are oppositely and axially formed with a pair of rail slots allowing a pair of sliding rails at two sides of a second board member to pass and slide, said pair of fixing rails are provided with a positioning tower having a penetrated slot and allowing said automatic locking mechanism to be disposed and arranged at a location corresponding to a locking hole of each of said sliding rails, and said pair of fixing rails have a stopping member disposed at one side of said positioning tower and arranged with an interval;
   each of said automatic locking mechanisms has a fastening pin, a latching tenon having a guiding surface and formed at a bottom end of said fastening pin and capable of passing said penetrated slot, a first angular tenon axially protruded at a top end of said latching tenon, a pulling handle disposed at an outer side of said penetrated slot, and an elastic member having a fastening end inserted in said positioning tower and an engaging end inserted in said fastening pin; said latching tenon of each of said automatic locking mechanisms is able to constantly and radially protrude in one of said pair of rail slots via an energy releasing effect provided by said elastic member, so that said guiding surface is oriented along an inserting direction towards one of said pair of rail slots for automatically locking said locking hole; and
   each of said manual unlocking mechanisms has a shaft rod and a spring, said spring is disposed in said stopping member and at one end of said shaft rod, a second angular tenon at another end of said shaft rod is able to pass said positioning tower and to be adjacent to said first angular tenon;
   through upwardly pulling said pulling handle, said latching tenon is able to retract into said penetrated slot, said first angular tenon crosses said second angular tenon for forming an abutting locked status, and said engaging end of said elastic member and said spring are compressed, thereby preventing said fastening pin from automatically falling.

2. The auxiliary sliding connection assembly as claimed in claim 1, wherein a lateral piece is radially protruded at a bottom end defined at an outer surface of each of said fixing rails, said lateral piece has at least one screw hole and at least one positioning pin, wherein each of said at least one screw hole allows a screwing member to pass so as to be screwed and connected to a penetrated hole correspondingly formed on said first board member.

3. The auxiliary sliding connection assembly as claimed in claim 2, wherein said lateral piece further has at least one positioning pin; wherein each of said at least one positioning pin is inserted in a positioning hole correspondingly formed on said first board member.

4. The auxiliary sliding connection assembly as claimed in claim 3, wherein said at least one screw hole and said at least one positioning pin are selectively disposed in a plurality of protruding parts radially protruded from each of said lateral pieces, respectively.

5. The auxiliary sliding connection assembly as claimed in claim 1, wherein a front portion and a rear portion defined on a top surface of each of said pair of rail slots are oppositely and respectively formed with a notch.

6. The auxiliary sliding connection assembly as claimed in claim 1, wherein a front portion and a rear portion defined at a bottom end of each of said pair of rail slots are respectively formed with a dodging slot.

7. The auxiliary sliding connection assembly as claimed in claim 1, wherein each outer circumferences of said latching tenon is protruded with at least one convex rib except said guiding surface, thereby increasing a connecting tightness with said penetrated slot.

8. The auxiliary sliding connection assembly as claimed in claim 1, wherein said guiding surface is an inclined surface or an arc-shaped surface.

9. The auxiliary sliding connection assembly as claimed in claim 1, wherein said elastic member is a torsion spring, said fastening end of said torsion spring is inserted in a foot hole of said positioning tower, and said engaging end thereof is inserted in a pin hole of said fastening pin; wherein, said positioning tower is laterally communicated with a spring chamber where said torsion spring is disposed, and a spring column for being sleeved in a plurality of coils of said torsion spring is protruded from said spring chamber.

10. The auxiliary sliding connection assembly as claimed in claim 1, wherein an outer circumference of said spring column is protruded with at least two flanges, and each of said flanges has an inclined surface, so that after said plurality of coils sleeve said spring column, said plurality of coils are prevented from falling.

11. The auxiliary sliding connection assembly as claimed in claim 1, wherein said manual unlocking mechanism further has a supporting member located between said positioning tower and said stopping member, and said supporting member is arranged to be adjacent to said shaft rod.

12. The auxiliary sliding connection assembly as claimed in claim 11, wherein said supporting member is a T-shaped or reversed-L-shaped convex rail, and at least one side at a bottom end of said shaft rod has at least one buckle hook allowing said convex rail to be buckled, so that said shaft rod is able to axially move on said supporting member.

13. The auxiliary sliding connection assembly as claimed in claim 1, wherein said stopping member is an accommodation chamber allowing said spring to be accommodated, and a supporting shaft at one end of said shaft rod is sleeved with said spring.

14. The auxiliary sliding connection assembly as claimed in claim 1, wherein said elastic member is a U-shaped linear spring, said positioning tower has a fastening slot allowing said fastening end of said U-shaped linear spring to be disposed and arranged at an opposite side of said manual unlocking mechanism, said engaging end of said U-shaped linear spring is allowed to pass said positioning tower and inserted in a pair of pin holes oppositely formed on said fastening pin.

* * * * *